United States Patent
Lee et al.

(10) Patent No.: US 9,000,455 B2
(45) Date of Patent: Apr. 7, 2015

(54) SHADOW MASK ASSEMBLY

(71) Applicant: TSMC Solid State Lighting Ltd., Hsin-Chu (TW)

(72) Inventors: Ming-Shing Lee, Zhudong Township, Hsinchu County (TW); Chyi-Shyuan Chern, Taipei (TW); Hsin-Hsien Wu, Hsinchu (TW); Yung-Chang Chen, Hsinchu (TW); Ming-Hua Lo, Zhongli (TW); Chu-Ching Tsai, Hsinchu (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 9 days.

(21) Appl. No.: 13/792,136

(22) Filed: Mar. 10, 2013

(65) Prior Publication Data

US 2014/0252380 A1    Sep. 11, 2014

(51) Int. Cl.
*H01L 33/08*    (2010.01)
*H01L 21/00*    (2006.01)

(52) U.S. Cl.
CPC ............... *H01L 33/08* (2013.01); *H01L 21/00* (2013.01); *H01L 2933/0041* (2013.01)

(58) Field of Classification Search
CPC ........................................................ H01L 33/08
USPC .................... 257/88; 118/301, 505; 216/12; 156/345.3
See application file for complete search history.

(56) References Cited

U.S. PATENT DOCUMENTS

| | | | | |
|---|---|---|---|---|
| 2007/0048894 A1* | 3/2007 | Frischknecht | ................ | 438/99 |
| 2010/0301888 A1* | 12/2010 | Yonezawa et al. | ........ | 324/756.03 |
| 2011/0131792 A1* | 6/2011 | Kwak et al. | ................ | 29/592.1 |

FOREIGN PATENT DOCUMENTS

JP    2005350712 A    * 12/2005    ............. H01L 51/50

* cited by examiner

*Primary Examiner* — Matthew Landau
*Assistant Examiner* — Eric Ashbahian
(74) *Attorney, Agent, or Firm* — Haynes and Boone, LLP

(57) ABSTRACT

A shadow mask assembly includes a securing assembly configured to hold a substrate that is configured to hold a plurality of dies. The securing assembly includes a number of guide pins and a shadow mask comprising holes for the guide pins, said holes allowing the guide pins freedom of motion in one direction. The securing assembly includes a number of embedded magnets configured to secure the shadow mask to the securing assembly.

20 Claims, 5 Drawing Sheets

SHADOW MASK ASSEMBLY

BACKGROUND

Light Emitted Diode (LED) displays are becoming common for computer, television, tablet, and smart-phone screens. An LED is a type of diode that emits light in response an applied electric current. An LED display includes an array of LED cells, and an LED cell includes a group of LEDs, such as red, green, and blue LEDs. By varying the intensity of each of the LED in a cell, various colors can be produced. The multiple cells, or pixels, can form images and video to a human viewer.

Often, the fabrication of LEDs involves the coating of phosphors onto an LED die. A phosphor is a luminescent material. The phosphor is typically coated onto an LED die using a spray process. A shadow mask is used to expose certain regions of a number of LED dies to the spray process. The shadow mask is typically secured to a jig that holds a substrate having a number of LED dies, or another substrate holding the LED dies, through pins or screws. During the spray coating process, the shadow mask is susceptible to thermal expansion which can cause strain on the pins or screws used to secure the shadow mask. It is thus desirable to perform a spray coating process without causing too much stress on the thermal mask, which can lead to a lower quality coating.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
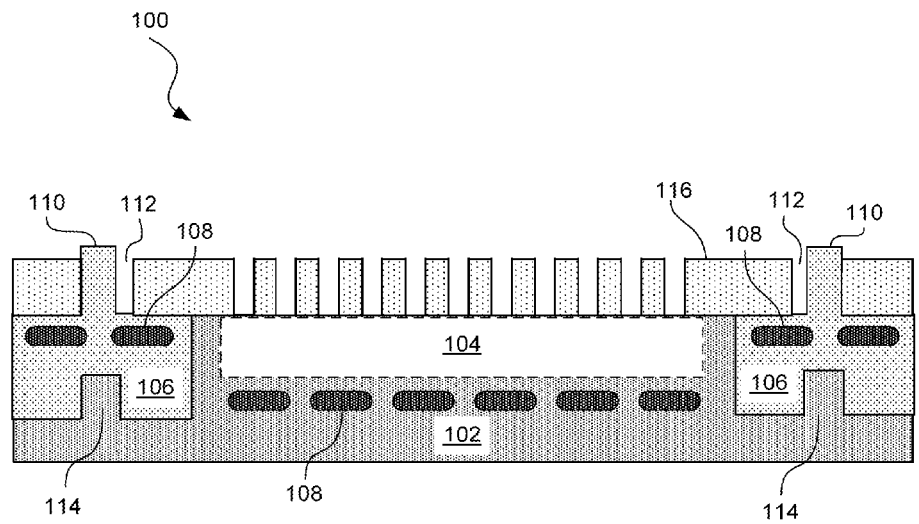
FIG. 1A is a diagram showing an illustrative cross-sectional view of a shadow mask assembly having embedded magnets, according to one example of principles described herein.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

As mentioned above, the fabrication of LEDs involves the spray coating of a phosphor layer onto an LED die. The phosphor layer may include either phosphorescent materials and/or fluorescent materials. The phosphor layer may be coated on the surfaces of the LED dies in a concentrated viscous fluid medium (e.g., liquid glue). As the viscous liquid sets or cures, the phosphor material becomes a part of the LED package. In practical LED applications, the phosphor layer may be used to transform the color of the light emitted by an LED dies. For example, the phosphor layer can transform a blue light emitted by an LED die into a different wavelength light. By changing the material composition of the phosphor layer, the desired light color emitted by the LED die may be achieved.

The efficiency at which light color is changed by the phosphor may depend in part on the quality of the phosphor layer. Specifically, it is desired that a clean coating of phosphor be applied. Moreover, it is important that the phosphor particles do not get deposited on regions other than where they are intended to be deposited.

According to principles described herein, an efficient spray coating process is achieved by using a shadow mask assembly that involves the use of magnets. Specifically, a jig structure used to support the LED dies and the substrate holding the LED dies is secured to a shadow mask through use of magnets embedded in the jig structure. This creates a strong seal between the shadow mask and the substrate holding the LED dies. This prevents phosphor particles from getting placed at those regions between the LED dies.

Moreover, the shadow mask is aligned through use of guide pins within the jig structure and corresponding guide holes in the shadow mask. The guide holes and guide pins can be designed so that the shadow mask is allowed to expand during the spray coating process. The thermal expansion resulting from the spray coating process may otherwise put too much strain on the shadow mask so as cause adverse effects.

Using a shadow mask assembly embodying principles described herein, the fabrication process can be made more efficient. For example, the shadow mask described herein is easier to clean and thus it can be made ready for subsequent batches relatively quickly. Additionally, the shadow mask may last longer because it experiences less lateral strain due to thermal expansion.

FIG. 1A is a diagram showing an illustrative cross-sectional view of a shadow mask assembly 100 having embedded magnets 108. According to certain illustrative examples, the shadow mask assembly 100 includes a securing assembly which includes a bottom jig 102 and an upper jig 106. The shadow mask assembly 100 also includes a substrate 104 and a shadow mask 116. The substrate 104 includes a number of dies (not shown) which will be illustrated and described in further detail below with the text accompanying FIG. 3. In some examples, the dies may be LED dies. For the purposes of illustration, the dies will be referred to hereafter as LED dies. However, it is understood that other types of components secured to a substrate may be used in accordance with principles described herein.

The substrate 104 is the work piece and is thus not part of the assembly. As such, the substrate 104 is illustrated with dotted lines. The shadow mask assembly 100 is used to hold the LED dies in place and to allow for a phosphor spray coating process to precisely spray the intended regions of the LED dies. In some examples, a different kind of spray coating process may be used. For example, if the dies are not LED dies but are to receive some type of coating, then the spray coating process may be used to spray that type of coating.

The bottom jig 102 secures the substrate 104 in place. The bottom jig 102 may secure the substrate 104 through a number of mechanisms. For example, the bottom jig 102 may include a well having a same exterior dimensions as the substrate 104. The substrate 104 may be a semiconductor substrate that has been fabricated with circuitry to control the LEDs on the LED dies that is attached to the substrate 104.

The upper jig 106 is secured to the bottom jig 102. In the present example, the upper jig 106 is secured to the bottom jig 102 using pins 114. Specifically, the bottom jig 102 includes pins 114, and the upper jig includes indentations in which the pins 114 fit. Other methods, however, may be used to secure the bottom jig 102 to the upper jig 106. For example, the bottom jig 102 and the upper jig 106 may both include embedded magnets that secure them. In another example, the bottom jig 102 and the upper jig 106 may be connected by an external latch. In some cases, the securing assembly may be one piece, instead of being separated into a bottom jig 102 and an upper jig 106.

The upper jig 106 also includes guide pins 110 to guide the placement of the shadow mask 116. The placement of the shadow mask 116 is such that holes in the mask are properly positioned over the regions of the LED where phosphor coating is sprayed. The guide pins 110 correspond to guide holes 112 in the shadow mask 116. The guide pins 110 and guide holes 112 are such that the guide pins are used for guiding purposes and are not used for securing the shadow mask 116 to the securing assembly.

According to the present example, magnets 108 are embedded within the upper jig 106 and the bottom jig 102. When the magnets 108 are embedded in both the bottom jig 102 and upper jig 106, they should not overlap because doing so would cause the two jigs 102, 106 to repel against each other. In some cases, however, the magnets may be embedded in either the upper jig 106 or the bottom jig 102, but not both. These magnets 108 are used to secure the shadow mask 116 to the securing assembly. Thus, there is no need for screws or other securing mechanisms to secure the shadow mask 116 to the securing assembly. The magnets 108 allow easy fastening of the shadow mask 116 to the upper jig 106 and reduce lateral constrain during thermal expansion of the shadow mask because the guide pin holes allow some freedom of motion. Additionally, placement of the magnets 108 in the bottom jig 102 can help with the planarization of the shadow mask 116. Specifically, the magnets 108 can be designed to help keep the shadow mask 116 on an even plane during the spray coating process.

The shadow mask 116 is used to cover the LED die during the spray coating process. The shadow mask 116 includes a pattern of specifically designed holes that direct the phosphor spray at the desired regions of the LED dies. The shadow mask 116 is made of a material that is attracted to the magnets 108. The nature of the magnets 108 and the material of the shadow mask are such that the attractive force between the two is enough to properly secure the shadow mask 116 to the securing assembly without causing too much stress on the shadow mask 116. Moreover, the magnetic force creates a seal between the shadow mask 116 and the substrate 104 during the phosphor spraying process. This seal prevents phosphor coating particles from being deposited in the regions between the LED dies.

The shadow mask 116 may be made from a variety of materials and in a variety of methods. In some cases, the shadow mask 116 may be a multi-level shadow mask. In the present example, however, the shadow mask 116 is an integrated shadow mask 116. That is, it is one solid component rather than several thin components stacked together. In one example, the shadow mask 116 is made of a material referred to as SUS420.

Using an integrated shadow mask can reduce assembly tolerance. Additionally, the integrated shadow mask is easier to operate, clean, and maintain. The integrated shadow mask is also cost less than a multi-level shadow mask.

The phosphor spray coating process involves relatively high temperatures that may cause thermal expansion of the shadow mask 116. Because the shadow mask 116 is secured to the securing assembly with magnetic forces, as opposed to a securing pin or screw, the thermal expansion does not put adverse strain on the shadow mask 116. Additionally, the nature of the guide pins 110 and guide holes 112 can be such that an amount of thermal expansion is allowed without causing stress on the shadow mask.

Figure 1B:
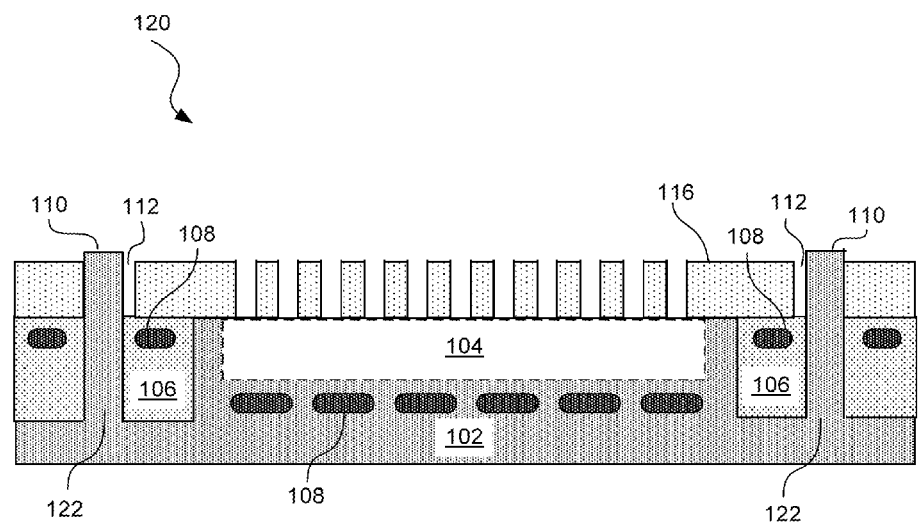
FIG. 1B is a diagram showing an illustrative cross-sectional view of a shadow mask assembly having embedded magnets, according to one example of principles described herein.

FIG. 1B is a diagram showing an illustrative cross-sectional view of a shadow mask assembly 100 having embedded magnets, wherein the guide pins are part of the bottom jig 102. According to the present example, the bottom jig 106 includes a set of guide pins 122 that extend through the upper jig 106 and through the guide holes 112 of the shadow mask 116. The guide pins 122 can be used to securely connect the bottom jig 102 to the upper jig 106. Additionally, the guide pins 122 act as a guiding mechanism for the shadow mask 116 while still allowing for thermal expansion of the shadow mask 116 during the spray coating process.

The strength of the magnets 108 may be such that they securely hold the shadow mask 116 against the substrate 104 without providing too much vertical strain on the shadow mask 115. If the magnets 108 were too strong, then it would be more difficult for the shadow mask to expand appropriately during the spray coating process. Thus, there would still be some warping of the shadow mask 116. In order to choose an appropriate strength for the magnets 108, the magnetic susceptibility of the shadow mask 116 may be considered as well. For example, if the magnetic susceptibility of the shadow mask 116 is high, then magnets 108 with less strength may be used. Conversely, if the magnetic susceptibility of the shadow mask is relatively low, then magnets 108 with more strength may be used.

The LED dies formed on the substrate may be used in a variety of applications. For example, the LEDs of the present disclosure may be used in lighting applications including, but not limited to, vehicle headlights or taillights, vehicle instrument panel displays, light sources of projectors, light sources of electronics such as Liquid Crystal Display (LCD) televisions or LCD monitors, tablet computers, mobile telephones, or notebook/laptop computers.

Figure 2A:
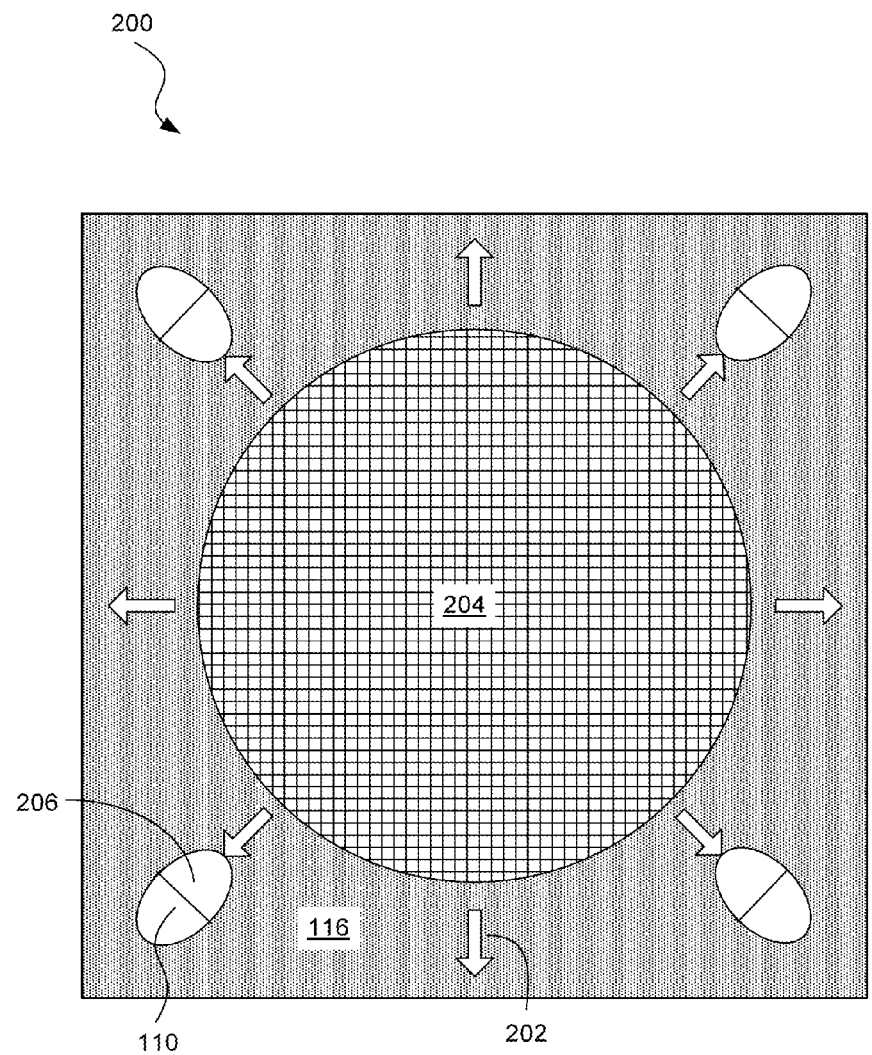
FIG. 2A is a diagram showing an illustrative top view of a shadow mask with elliptical guide holes, according to one example of principles described herein.

FIG. 2A is a diagram showing an illustrative top view 200 of a shadow mask 116. As mentioned above, the shadow mask 116 includes a section 204 with a pattern of specially designed holes. Specifically, the section 204 illustrates an array of several individual holes, each hole corresponding to an LED. In this example, that section is circular. In other examples, however, the section 204 may be of different shapes.

In the present example, the guide pins 110 are in the shape of a semi-circular ellipse. This leaves a space 206 between the guide pins 110 and the center of the shadow mask 116. This space 206 allows for thermal expansion of the shadow mask. During the phosphor spray coating process, the temperature can exceed 50 degrees Celsius. This causes the shadow mask to expand in an outward direction 202.

The guide pins 110 may be of a variety of shapes and leave a space 206 in other shapes besides a semi-circular shape. The guide pins 110 may be designed to allow enough space 206 for the predicted amount of thermal expansion during the spray coating process while still effectively guiding the shadow mask 116 into the proper position. In some examples, the guide pins 110 are circular while the guide holes of the shadow mask 116 are elliptical. The elliptical dimensions may be such that an appropriate freedom of motion is allowed during thermal expansion so as to avoid unacceptable lateral strain on the shadow mask 116.

Figure 2B:
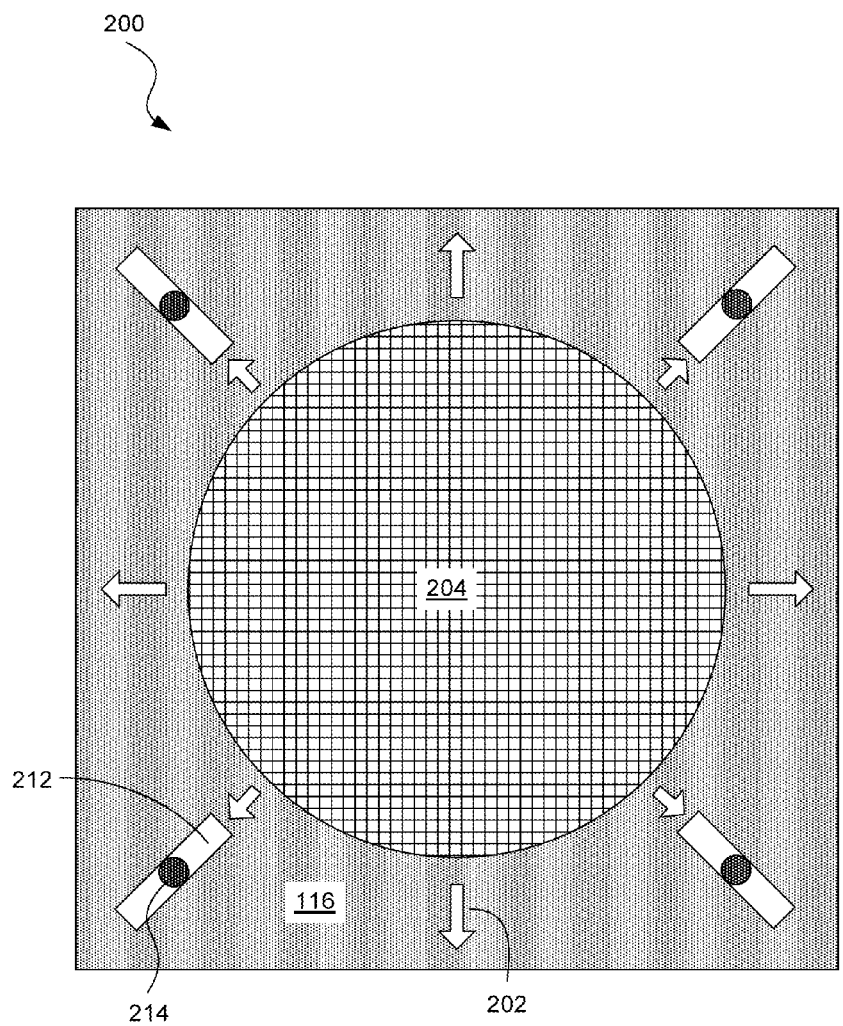
FIG. 2B is a diagram showing an illustrative top view of a shadow mask with guide slots, according to one example of principles described herein.

FIG. 2B is a diagram showing an illustrative top view of a shadow mask with guide slots. According to the present example, the shadow mask 116 includes four guide slots 212. Each guide slot is oriented towards the center of the shadow mask 116. The jig structure corresponding to a shadow mask 116 with guide slots 212 may include circular guide pins 214. Other shapes, however, may be used for the guide pins 214. For example, the guide pints 214 may be square or rectangular shaped and oriented to fit within the guide slots 212. In some examples, the guide slots 212 may have rounded edges. The guide slots 212 may also be of a variety of lengths.

The orientation of the slots allows the shadow mask 116 to expand during the spray coating process without causing too much strain on the mask 116. The length of the guide slots 212 may be set to account for anticipated thermal expansion. By including at least four slots as illustrated, the guide pins 212 effectively align the shadow mask 116 with an underlying substrate so that the phosphor spray coating process can occur as desired.

Figure 3:
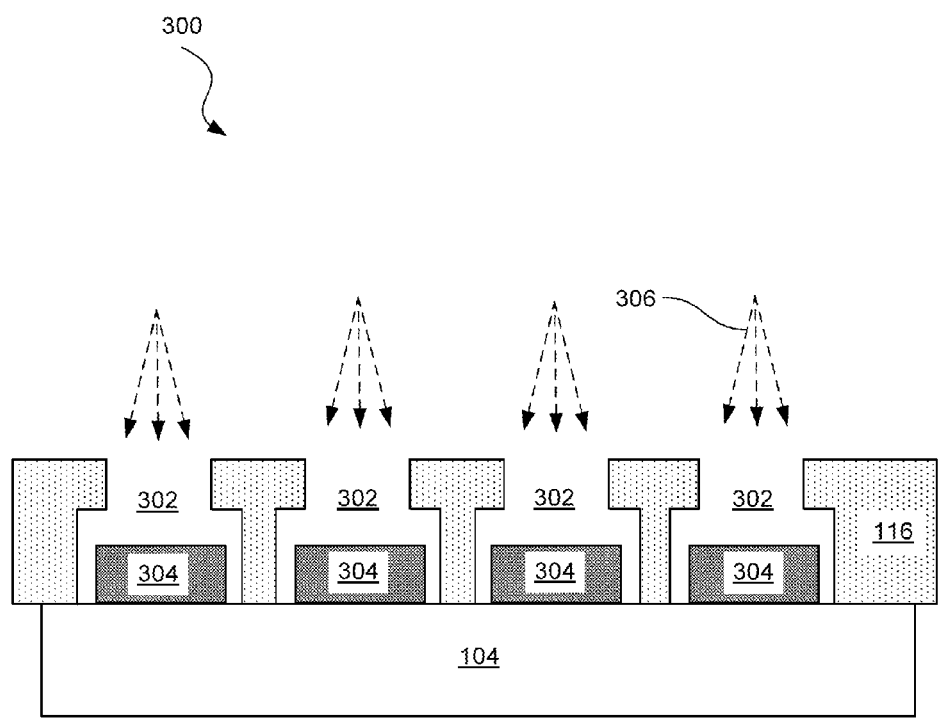
FIG. 3 is a diagram showing an illustrative spray coating process onto LED dies through a shadow mask, according to one example of principles described herein.

FIG. 3 is a diagram 300 showing an illustrative spray coating process onto LED dies through a shadow mask 116. Specifically, FIG. 3 illustrates a cross sectional view of the specially designed holes 302. These holes are designed to fit around the active regions 304 of the LED die. Each active region 304 corresponds to a single LED. The LED is connected to the circuitry within the substrate 104 through bond wires which are shown on the sides of the active regions 304. The holes 302 allow for the phosphor spray coating process 306 to coat phosphor on top of each active region 304 in a specific manner so that the LED gives off the desired color when turned on and emitting light.

While only four LED active regions 304 are illustrated, it is understood that a practical embodiment of principles described herein will include an array with a much larger number of LED active regions. Moreover, while the holes 302 within the shadow mask 116 are shown with a wider lower section than an upper section, other types of holes 302 may be used in accordance with principles described herein. For example, the holes 302 may be conical in shape, with the higher portion being narrower than the lower portion. The narrower portion on top protects the spray coating 306 form reaching regions where it is not intended to be sprayed.

Figure 4:
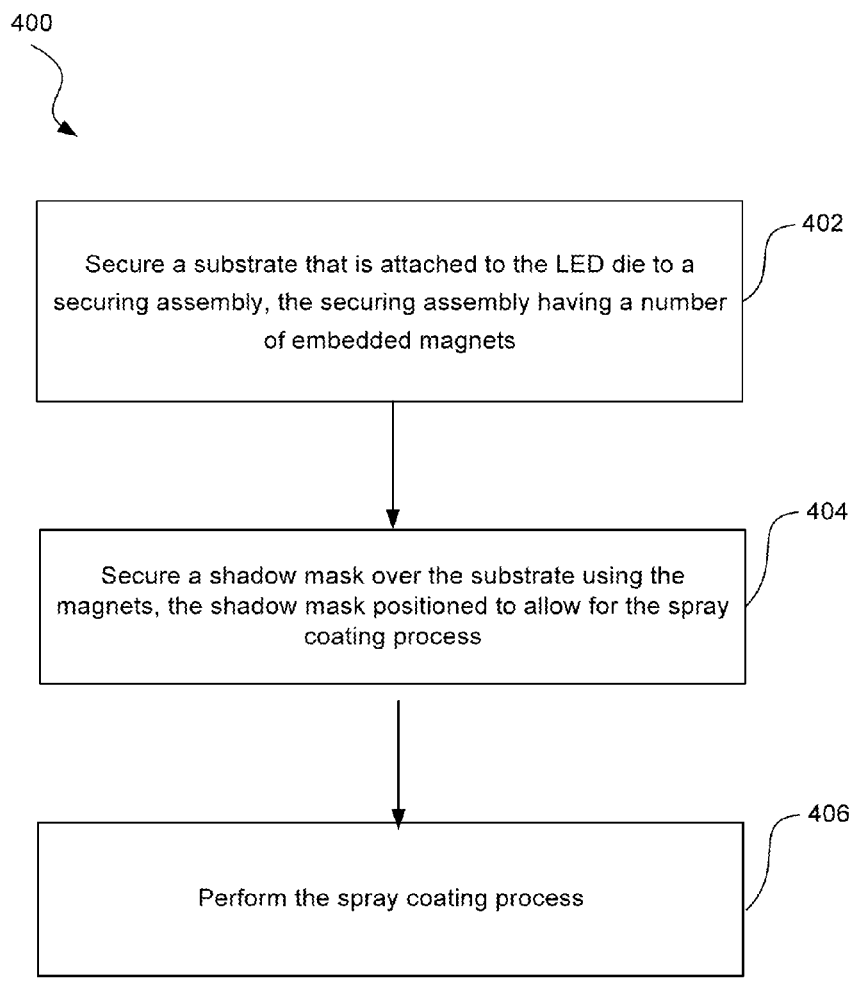
FIG. 4 is a flowchart showing an illustrative method for performing a spray coating process with a shadow mask having embedded magnets, according to one example of principles described herein.

FIG. 4 is a flowchart showing an illustrative method for performing a spray coating process with a shadow mask having embedded magnets. According to certain illustrative examples, the method includes a step of securing 402 a substrate that is attached to the LED die to a securing assembly. The securing assembly includes a number of embedded magnets. In some examples, the securing assembly may include a bottom jig and an upper jig as illustrated in FIGS. 1A and 1B. The magnets may be embedded on the bottom jig, the upper jig or both.

The method further includes a step of securing 404 a shadow mask over the substrate using the magnets. The shadow mask is positioned to allow for the spray coating process. A set of guide pins are used to secure the shadow mask. The shadow mask includes a number of guide holes or guide slots positioned so that when placed over the guide pins, the shadow mask is appropriately aligned with the underlying substrate and LED dies. The guide holes or guide slots on the shadow mask are further designed to allow for a freedom of motion. Thus, the shadow mask can freely expand or contract based on externally applied conditions.

The method further includes a step of performing 406 the spray coating process. As mentioned above, the spray coating process is used to spray phosphor materials onto the LED dies. The phosphor materials may be used to cause the LED to emit specific wavelengths (colors) of light. This spray coating process causes thermal expansion of the shadow mask. Because of the nature of the guide pins and guide holes or slots, the shadow mask is able to expand without causing too much stress on the mask assembly. Moreover, the seal between the shadow mask and the substrate can be maintained.

According to principles described herein, an efficient spray coating process is achieved by using a shadow mask assembly that involves the use of magnets. Specifically, a jig structure used to support the LED dies and the substrate holding the LED dies is secured to a shadow mask through use of magnets embedded in the jig structure. This creates a strong seal between the shadow mask and the substrate holding the LED dies. This prevents phosphor particles from getting placed at those regions between the LED dies.

Moreover, the shadow mask is aligned through use of guide pins within the jig structure and corresponding guide holes in the shadow mask. The guide holes and guide pins can be designed so that the shadow mask is allowed to expand during the spray coating process. The thermal expansion resulting from the spray coating process may otherwise put too much strain on the shadow mask so as cause adverse effects.

According to certain illustrative examples, a shadow mask assembly includes a securing assembly configured to hold a substrate that is configured to hold a plurality of dies. The securing assembly includes a number of guide pins and a shadow mask comprising holes for the guide pins, said holes allowing the guide pins freedom of motion in one direction.

The securing assembly includes a number of embedded magnets configured to secure the shadow mask to the securing assembly.

A method for spray coating a die includes securing a substrate that is attached to a plurality of dies to a securing assembly, the securing assembly having a number of embedded magnets, securing a shadow mask over the substrate using the magnets, the shadow mask positioned to allow for the spray coating process, and performing the spray coating process.

According to certain illustrative examples, a shadow mask assembly used in a spray coating process includes a shadow mask assembly used in a spray coating process, the assembly includes a bottom jig configured to be secured to a substrate having a plurality of Light Emitting Diode (LED) dies thereon, the bottom jig having a number of embedded magnets, an upper jig secured to the bottom jig and including a number of guide pins and a number of embedded magnets. The assembly further includes a shadow mask that includes a number of guide holes for the guide pins and being made of a material that is attracted to the magnets.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A shadow mask assembly comprising:
    a securing assembly configured to hold a substrate that is configured to hold a plurality of dies, the securing assembly comprising:
    an upper jig and a lower jig, wherein at least one of the upper jig and the lower jig includes a number of guide pins, and wherein a surface of the upper jig is coplanar with an upper surface of the lower jig; and
    a shadow mask comprising holes for the guide pins, said holes allowing the guide pins freedom of motion in one direction;
    wherein, the securing assembly includes a number of embedded magnets configured to secure the shadow mask to the securing assembly.

2. The assembly of claim 1, wherein the shadow mask is made of a material that is attracted to the embedded magnets.

3. The assembly of claim 1, wherein the surface of the upper jig is in direct contact with the shadow mask.

4. The assembly of claim 1, wherein the embedded magnets are embedded both in the upper jig and the lower jig.

5. The assembly of claim 1, wherein the one direction is toward a center of the shadow mask.

6. The assembly of claim 5, wherein the freedom of motion is sufficient to allow for a thermal expansion of the shadow mask during a phosphor spray coating process.

7. The assembly of claim 5, wherein a space between the guide pins and the shadow mask is sufficient to allow for a thermal expansion of the shadow mask due to exposure of a temperature of about 50 degrees Celsius.

8. The assembly of claim 1, wherein the shadow mask is an integrated shadow mask.

9. The assembly of claim 1, wherein the dies comprise LED dies.

10. A shadow mask assembly used in a spray coating process, the assembly comprising:
    a bottom jig configured to be secured to a substrate having a plurality of Light Emitting Diode (LED) dies thereon, the bottom jig having a number of embedded magnets;
    an upper jig secured to the bottom jig and including:
        a number of guide pins; and
        a number of embedded magnets;
    wherein at least one surface of the upper jig is coplanar with an upper surface of the bottom jig; and
    a shadow mask that includes a number of guide holes for the guide pins and being made of a material that is attracted to the magnets.

11. The assembly of claim 10, wherein the guide holes are such that there is a space between the guide pins and a center of the shadow mask, the space being sufficient to allow for thermal expansion during the spray coating process.

12. The assembly of claim 10, wherein the shadow mask includes an integrated shadow mask.

13. An assembly, comprising:
    a securing assembly configured to hold a work piece, wherein the securing assembly includes a first jig, a second jig located below the first jig, the second jig including a plurality of guide pins that protrudes above an upper surface of the first jig;
    a plurality of magnets disposed within the securing assembly; and
    a shadow mask that includes a plurality of openings, the shadow mask containing a magnetically susceptible material, wherein each of the openings is configured to accommodate a respective one of the guide pins while still allowing room for movement of the shadow mask during thermal expansion of the shadow mask.

14. The assembly of claim 13, wherein the securing assembly includes a well inside which the work piece is placed, the well having same dimensions as the work piece.

15. The assembly of claim 13, wherein:
    a first subset of the plurality of magnets is embedded within the first jig; and
    a second subset of the plurality of magnets is embedded within the second jig.

16. The assembly of claim 15, wherein the magnets in the first subset are non-overlapping with the magnets in the second subset.

17. The assembly of claim 13, wherein the openings of the shadow mask are configured as a plurality of guide slots that are each oriented toward a center of the shadow mask.

18. The assembly of claim 13, wherein the openings of the shadow mask each have an elliptical shape.

19. The assembly of claim 13, wherein a surface of the first jig is coplanar with an upper surface of the second jig.

20. The assembly of claim 13, wherein the first jig sits within the second jig.

* * * * *